United States Patent
Huang et al.

(10) Patent No.: US 11,567,274 B2
(45) Date of Patent: Jan. 31, 2023

(54) OPTICAL MODULE

(71) Applicant: Molex, LLC, Lisle, IL (US)

(72) Inventors: Sung-Ping Huang, Hsinchu (TW);
Zuon-Min Chuang, Taoyuan (TW);
Lung-Hua Huang, Taoyuan (TW);
Sheng-Pin Su, Hsinchu (TW)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 17/389,470

(22) Filed: Jul. 30, 2021

(65) Prior Publication Data

US 2022/0050248 A1  Feb. 17, 2022

Related U.S. Application Data

(60) Provisional application No. 63/066,327, filed on Aug. 17, 2020.

(51) Int. Cl.
| | |
|---|---|
| *G02B 6/42* | (2006.01) |
| *H01S 5/20* | (2006.01) |
| *G02B 6/43* | (2006.01) |
| *G02B 6/32* | (2006.01) |
| *G02B 6/26* | (2006.01) |

(52) U.S. Cl.
CPC ............ *G02B 6/4214* (2013.01); *G02B 6/43* (2013.01); *H01S 5/2018* (2013.01); *G02B 6/262* (2013.01); *G02B 6/327* (2013.01); *G02B 6/4251* (2013.01); *G02B 6/4271* (2013.01)

(58) Field of Classification Search
None
See application file for complete search history.

(56) References Cited

U.S. PATENT DOCUMENTS

| | | | |
|---|---|---|---|
| 6,941,043 B1 | 9/2005 | Major et al. | |
| 9,581,776 B1* | 2/2017 | Lee | ..................... G02B 6/4246 |
| 9,660,421 B2 | 5/2017 | Vorobeichik et al. | |
| 10,488,605 B1 | 11/2019 | Budd et al. | |
| 2006/0016962 A1* | 1/2006 | Ohtorii | .................... G02B 6/43 |
| | | | 250/208.2 |
| 2006/0050493 A1* | 3/2006 | Hamasaki | ............ G02B 6/4201 |
| | | | 361/767 |
| 2014/0010498 A1* | 1/2014 | Verslegers | ............... G02B 6/30 |
| | | | 385/37 |
| 2016/0266332 A1* | 9/2016 | Fasano | ................. G02B 6/4202 |
| 2017/0126318 A1* | 5/2017 | Chang | .................. G02B 6/4259 |
| 2018/0217326 A1* | 8/2018 | Brusberg | ............... G02B 6/122 |

(Continued)

FOREIGN PATENT DOCUMENTS

| | | |
|---|---|---|
| CN | 1507574 A | 6/2004 |
| CN | 102484353 A | 5/2012 |
| CN | 103197383 A | 7/2013 |

(Continued)

*Primary Examiner* — Jerry Rahll

(57) ABSTRACT

An optical module includes a waveguide interposer and at least one light source unit. The waveguide interposer includes at least one input terminal, at least one waveguide channel, and at least one output terminal. The at least one input terminal is configured to receive laser light, and the at least one waveguide channel is coupled to the at least one input terminal and is configured to guide the laser light. Each light source unit is configured to output the laser light to a corresponding input terminal of the at least one input terminal.

19 Claims, 11 Drawing Sheets

(56) References Cited

U.S. PATENT DOCUMENTS

2020/0203919 A1    6/2020  Zhang et al.

FOREIGN PATENT DOCUMENTS

| CN | 104350403 A | 2/2015 |
| CN | 105629402 B | 6/2018 |
| CN | 108885321 A | 11/2018 |
| CN | 110945976 A | 3/2020 |
| CN | 111258008 A | 6/2020 |
| EP | 2535749 A1 | 12/2012 |
| JP | H095582 A | 1/1997 |
| TW | 504595 B | 10/2002 |
| WO | 2020162216 A1 | 8/2020 |

* cited by examiner

OPTICAL MODULE

RELATED APPLICATION

The present application claims priority to U.S. Patent Application No. 63/066,327 filed on Aug. 17, 2020 which is incorporated by reference in its entirety.

TECHNICAL FIELD

The present disclosure relates to an optical module. Furthermore, the present disclosure relates to an optical module including a waveguide interposer.

BACKGROUND

Optical modules may include a light source, light, a component such as an optical interposer to route the light, fiber and connectors and adaptors. In such optical modules, light undergoes multiple transmission interface transfers as it enters one medium from another medium. With each transmission interface transfer, some energy is inevitably lost. As a result, the signal transmission quality of the optical module is degraded.

Additionally, in such optical modules, light may enter an optical interposer at a certain angle and must change a travel direction by 90 degrees before entering another medium. To prevent the light from losing excessive energy during the deflection an optical interposer must have a sufficient turning radius and relatively large width. It is desirable to reduce the number of transmission interface transfers, the width of the optical interposer and/or reduce the deflection angle in an optical interposer.

This background information is provided to reveal information believed by the applicant to be of possible relevance to the present invention. No admission is necessarily intended, nor should be construed, that any of the preceding information constitutes prior art against the present invention.

SUMMARY

Technical features and advantages that constitute the scope of the patent application of the present disclosure will be described below. A person of ordinary skill in the art of the present disclosure should understand that the concepts and specific embodiments disclosed below can be used to modify or design other structures or processes to achieve the same purpose as the present disclosure. A person of ordinary skill in the art of the present disclosure should also understand that such equivalent constructions cannot depart from the spirit and scope of the present disclosure as defined by the attached patent scope.

One aspect of the present disclosure provides an optical module. The optical module comprises a waveguide interposer and at least one light source unit. The waveguide interposer comprises at least one input terminal, at least one waveguide channel, and at least one output terminal. The at least one input terminal is configured to receive laser light. The at least one waveguide channel is coupled to the at least one input terminal, and configured to guide the laser light. Each light source unit in the at least one light source unit is configured to output the laser light to a corresponding input terminal of the at least one input terminal. In some embodiments, each light source unit in the at least one light source unit comprises a laser light source configured to generate the laser light and a lens configured to adjust a travel direction of the laser light.

In some embodiments, the lens is further configured to keep light beams of the laser light concentrated in a travel process to match a spot mode field of a waveguide.

In some embodiments, the at least one input terminal comprises at least one first input terminal, disposed on a first side of the waveguide interposer, each of the at least one first input terminal has a first light receiving surface, a first angle exists between the first light receiving surface and the first side, and the first angle, from a first outer surface of the first side joining the first light receiving surface of the first light receiving surface, is greater than 180 degrees and less than or equal to 270 degrees.

In some embodiments, the at least one input terminal comprises at least one first input terminal, disposed on a first side of the waveguide interposer, each of the at least one first input terminal has a first light receiving surface coplanar with a first outer surface of the second side joining the second light receiving surface.

In some embodiments, the at least one input terminal further comprises at least one second input terminal, disposed on a second side of the waveguide interposer, the first side and the second side are in different planes, each of the at least one second input terminal has a second light receiving surface, from a second outer surface of the second side joining the second light receiving surface to the second light receiving surface, is greater than 180 degrees and less than or equal to 270 degrees.

In some embodiments, the at least one input terminal further comprises at least one second input terminal, disposed on a second side of the waveguide interposer, the first side and the second side are in different planes, each of the at least one second input terminal has a second light receiving surface coplanar with a second outer surface of the second side joining the second light receiving surface.

In some embodiments, a total quantity of the at least one output terminal is greater than a total quantity of the at least one input terminal, and the waveguide interposer further comprises a splitting structure, configured to guide the laser light transmitted by each of the at least one waveguide channel into a plurality of output terminals.

In some embodiments, the at least one output terminal is arranged into a plurality of rows, a plurality of output terminals located in a same row are disposed in a first direction, and a plurality of output terminals located in different rows are disposed in a second direction different from the first direction.

In some embodiments, the optical module further comprises at least one temperature detector and a thermoelectric cooler (TEC). The thermoelectric cooler is connected to the at least one temperature detector, disposed below the at least one light source unit, and configured to adjust temperature of the at least one light source unit according to at least one temperature detected by the at least one temperature detector.

In some embodiments, the optical module further comprises a moisture-proof sealing box configured to accommodate the at least one light source unit and the waveguide interposer.

In some embodiments, the optical module further comprises at least one pin. The at least one pin is disposed on at least one lateral side of a moisture-proof sealing box. A first terminal of each pin in the at least one pin is disposed on an inner side of the moisture-proof sealing box and configured to be connected to one of the at least one light source unit by a bonding wire. A second terminal is disposed on an outer side of the moisture-proof sealing box and configured to receive an electrical signal.

In some embodiments, the material of the waveguide interposer is glass or silicon.

In some embodiments, the at least one output terminal is configured to output the laser light and is coupled to at least one fiber of a joined fiber connector.

In some embodiments, the joined fiber connector is a fiber connector of a mechanical transfer (MT) type.

In some embodiments, each light source unit in the at least one light source unit further comprises an optical isolator, disposed between the lens and a corresponding input terminal in the at least one input terminal, and configured to reduce reflected light generated when the laser light enters the corresponding input terminal.

Since the optical module uses a waveguide interposer to guide laser light generated by a light source unit to output terminals of the waveguide interposer so as to be directly coupled to fibers in an external joined fiber connector. Therefore, transmission interface transfer that the laser light needs to undergo when the laser light travels inside can be reduced, thereby reducing the energy loss of the laser light and improving the quality of signal transmission.

The above features and advantages and other features and advantages of the invention are readily apparent from the detailed description of the invention when taken in connection with the accompanying drawings.

BRIEF DESCRIPTION OF THE DRAWINGS

The detailed description is set forth with reference to the accompanying drawings illustrating example embodiments of the disclosure, in which the use of the same reference numerals indicates similar or identical items. Certain embodiments may include elements and/or components other than those illustrated in the drawings, and some elements and/or components may not be present in certain embodiments.

DETAILED DESCRIPTION OF THE PREFERRED EMBODIMENTS

Figure 1:
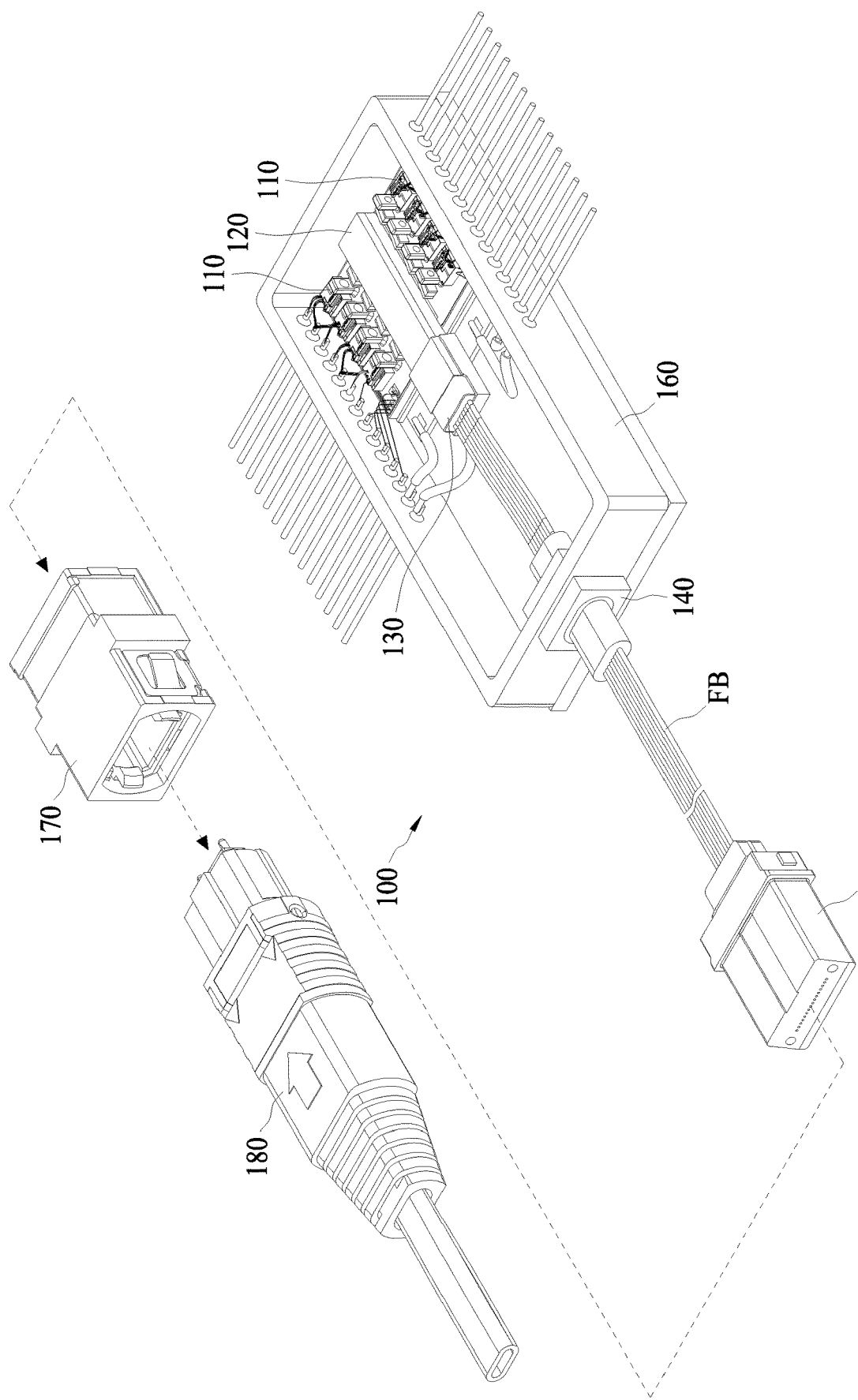
FIG. 1 is a schematic diagram of a conventional optical module.

The embodiments or examples of the content of the present disclosure shown in the drawings are described in more detail below. It should be understood that this is not intended to limit the scope of the present disclosure. One of ordinary skill in the art will appreciate that many variations and alterations to the following details are within the scope of the claims appended hereto. Accordingly, the following example embodiments are set forth without any loss of generality to, and without imposing limitations upon, the claimed invention disclosed herein.

It should be understood that although terms such as "first", "second", and "third" in this specification may be used for describing various elements, components, areas, layers, and/or sections, the elements, components, areas, layers, and/or sections are not limited by such terms. The terms are only used to distinguish one element, component, area, layer, or part from another element, component, area, layer, or part. Therefore, a first element, component, area, layer, or section described below may also be referred to as a second element, component, area, layer, or section without departing from the teachings of the inventive concept of the present disclosure.

The terms used by the present disclosure are merely used for describing particular embodiments rather than limiting the concept of the present invention. As used in this specification, the articles "a", "an", and "the" are intended to include plural forms, unless the context clearly indicates otherwise. It should also be understood that as used in this specification, the term "comprises," "includes," and "has" specify the presence of stated features, integers, steps, operations, elements, components, and/or combinations thereof, but do not preclude the presence or addition of one or more other features, integers, steps, operations, elements, components, and/or combinations thereof.

FIG. 1 is a schematic diagram of a conventional optical module 100. As shown in FIG. 1, the optical module 100 includes a plurality of light source units 110, an optical interposer 120, a fiber array 130, a fiber feedthrough seal 140, a fiber connector 150, and a moisture-proof sealing box 160. The light source unit 110 may generate laser light. The optical interposer 120 may guide the laser light emitted by the light source unit 110 to fibers in the fiber array 130, the fiber feedthrough seal 140 can further guide the laser light to the fiber connector 150 outside the moisture-proof sealing box 160, and then the laser light is guided to a joined fiber connector 180 via an adapter 170 for signal transmission.

In such case, the laser light generated by the light source unit 110 undergoes transmission interface transfer for the first time when entering the optical interposer 120 through air and undergoes transmission interface transfer for the second time when entering the fiber array 130 from the optical interposer 120. Next, the laser light passes through the fiber connector 150 from the fiber array 130 and is then guided to the joined fiber connector 180 via the adapter 170 to undergo transmission interface transfer for the third time. Every time the laser light undergoes transmission interface transfer, that is, every time the laser light enters one medium from another medium, some energy is inevitably lost. As a result, the signal transmission quality of the optical module 100 is degraded.

Figure 2:
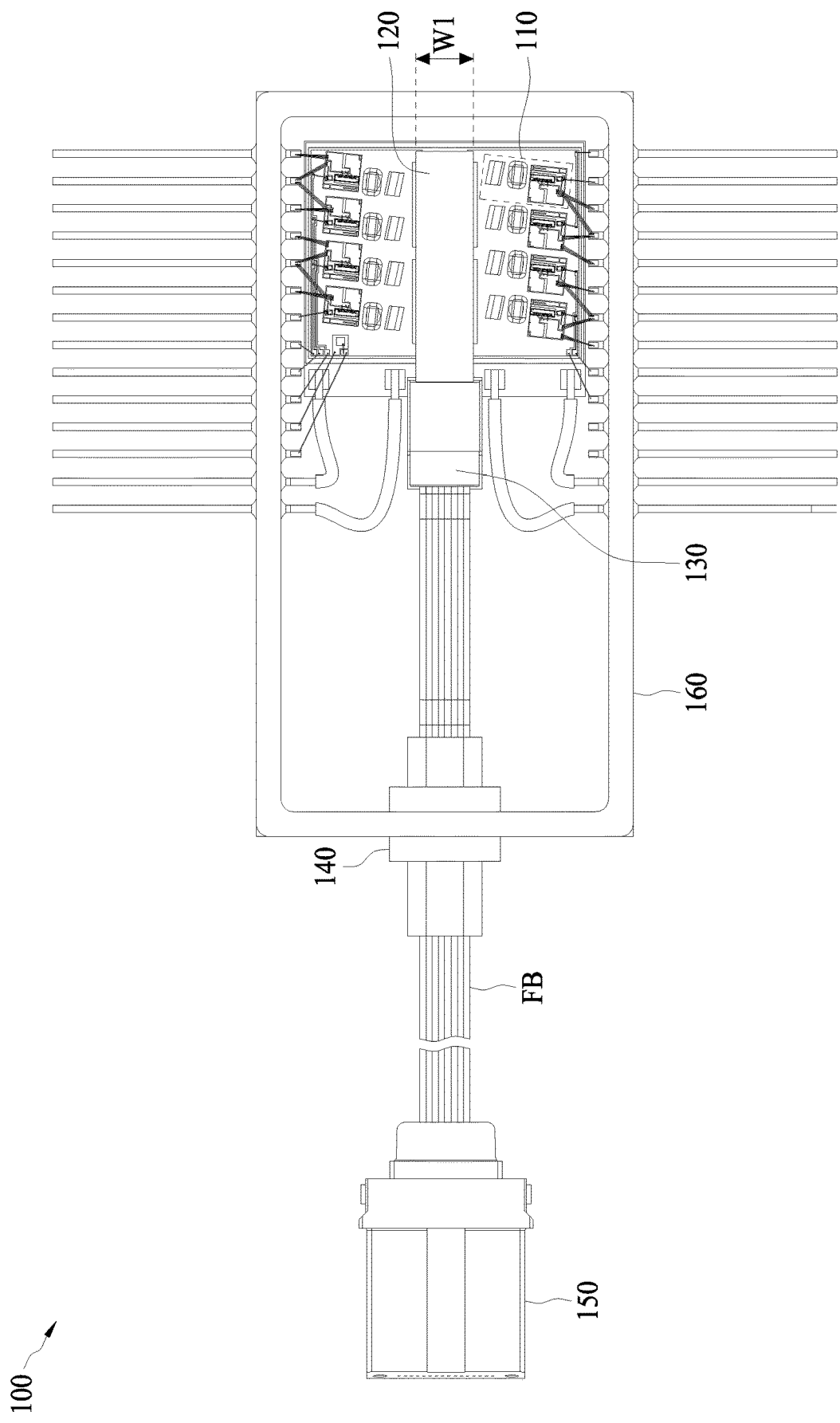
FIG. 2 is a top view of the optical module in FIG. 1.

In addition, FIG. 2 is a top view of the optical module 100. In FIG. 1 and FIG. 2, the plurality of light source units 110 are separately disposed on two sides of the optical interposer 120. Laser light emitted by the light source units 110 enter input terminals on corresponding sides of the optical interposer 120 at a vertical angle. In such case, after entering the optical interposer 120, the laser light needs to be guided by the optical interposer 120 to change a travel direction by 90 degrees before the laser light can enter the fiber array 130.

To prevent the laser light from losing excessive energy during deflection, a laser light channel in the optical interposer 120 needs to have a sufficient turning radius. In such case, the optical interposer 120 also needs to have a relatively large width W1, thereby increasing a space required by the optical module 100.

Figure 3:
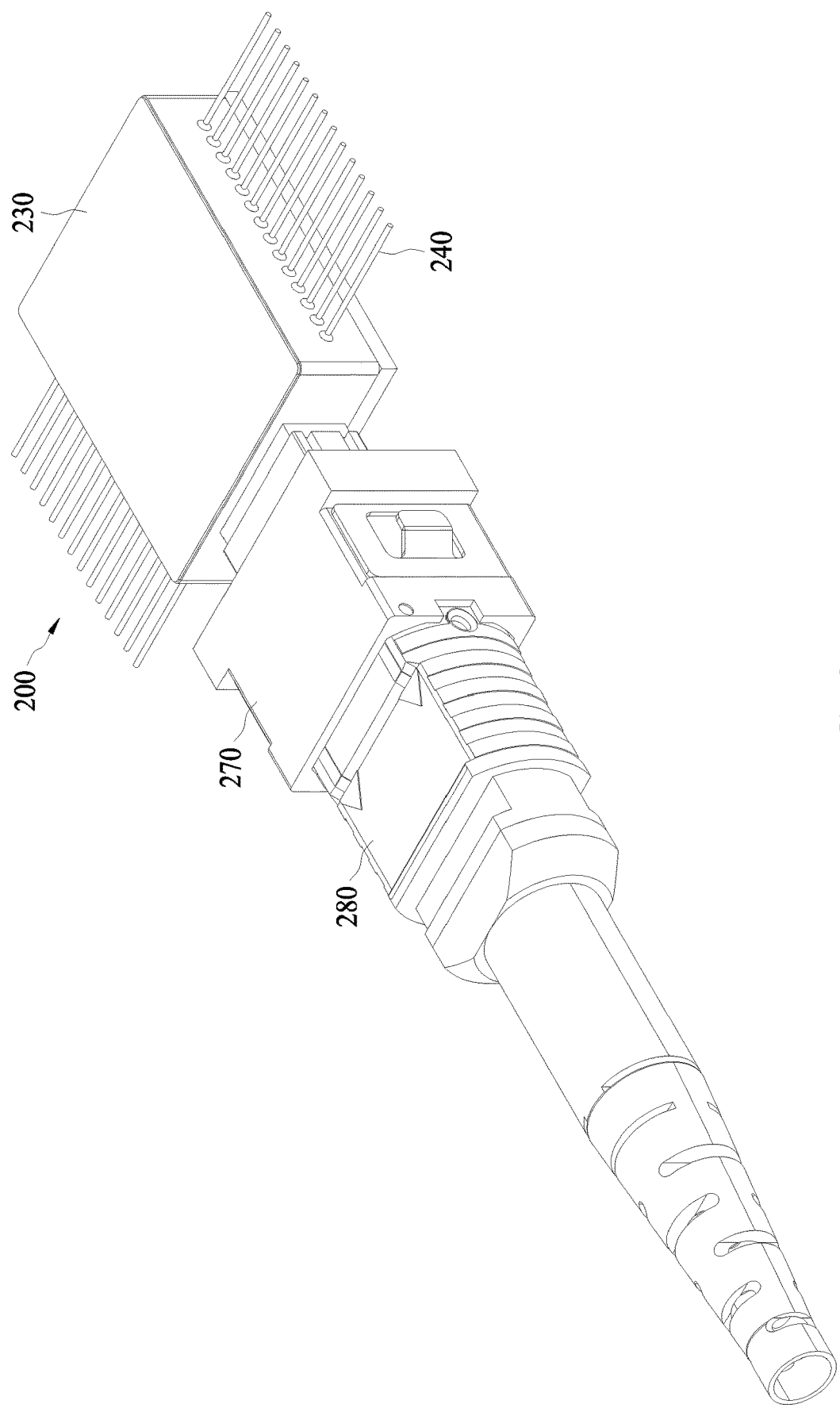
FIG. 3 is a schematic diagram of the appearance of an optical module, an adapter, and a joined fiber connector according to an embodiment of the present disclosure.
Figure 4:
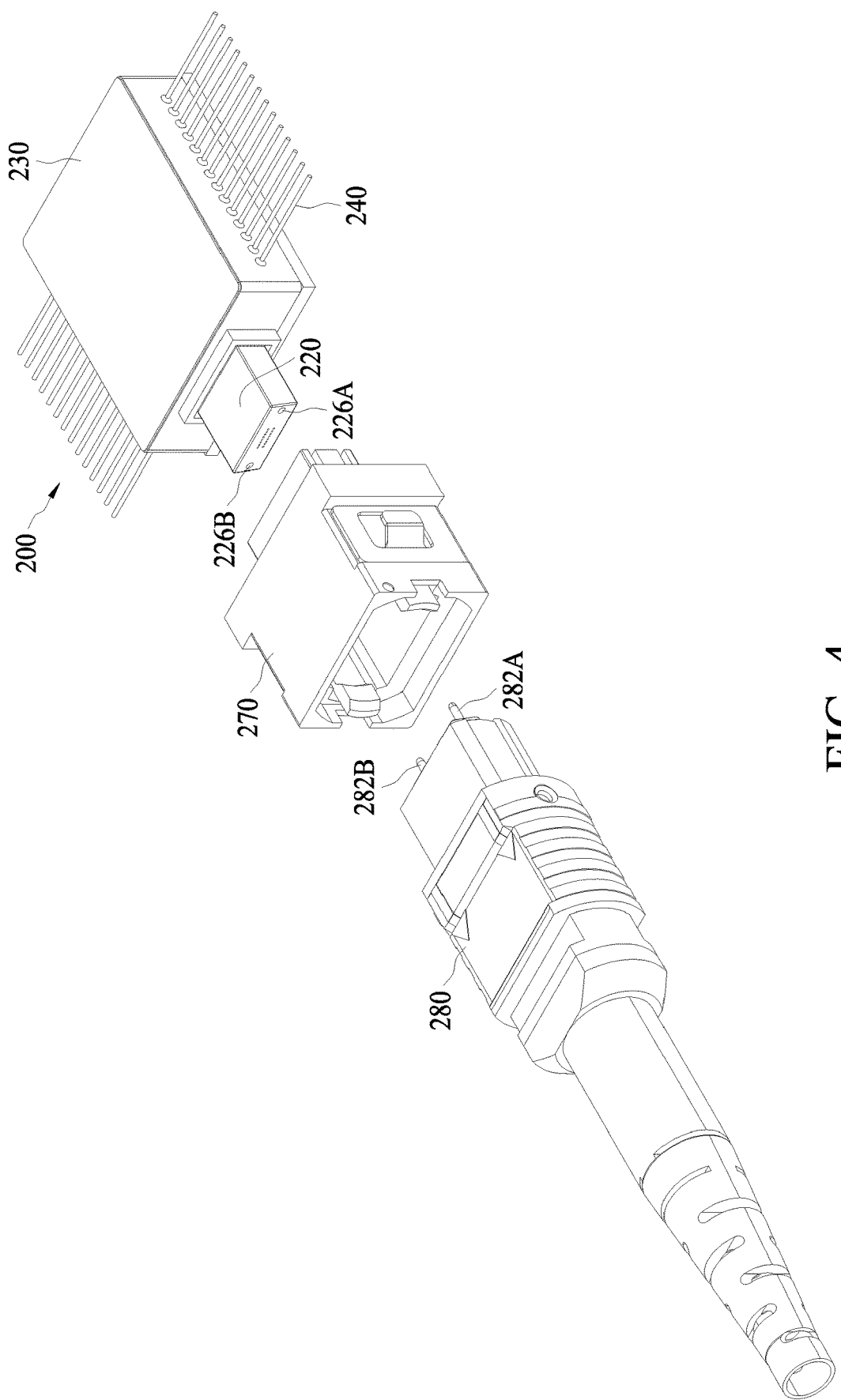
FIG. 4 is a top exploded view of the optical module, the adapter, and the joined fiber connector in FIG. 3.
Figure 5:
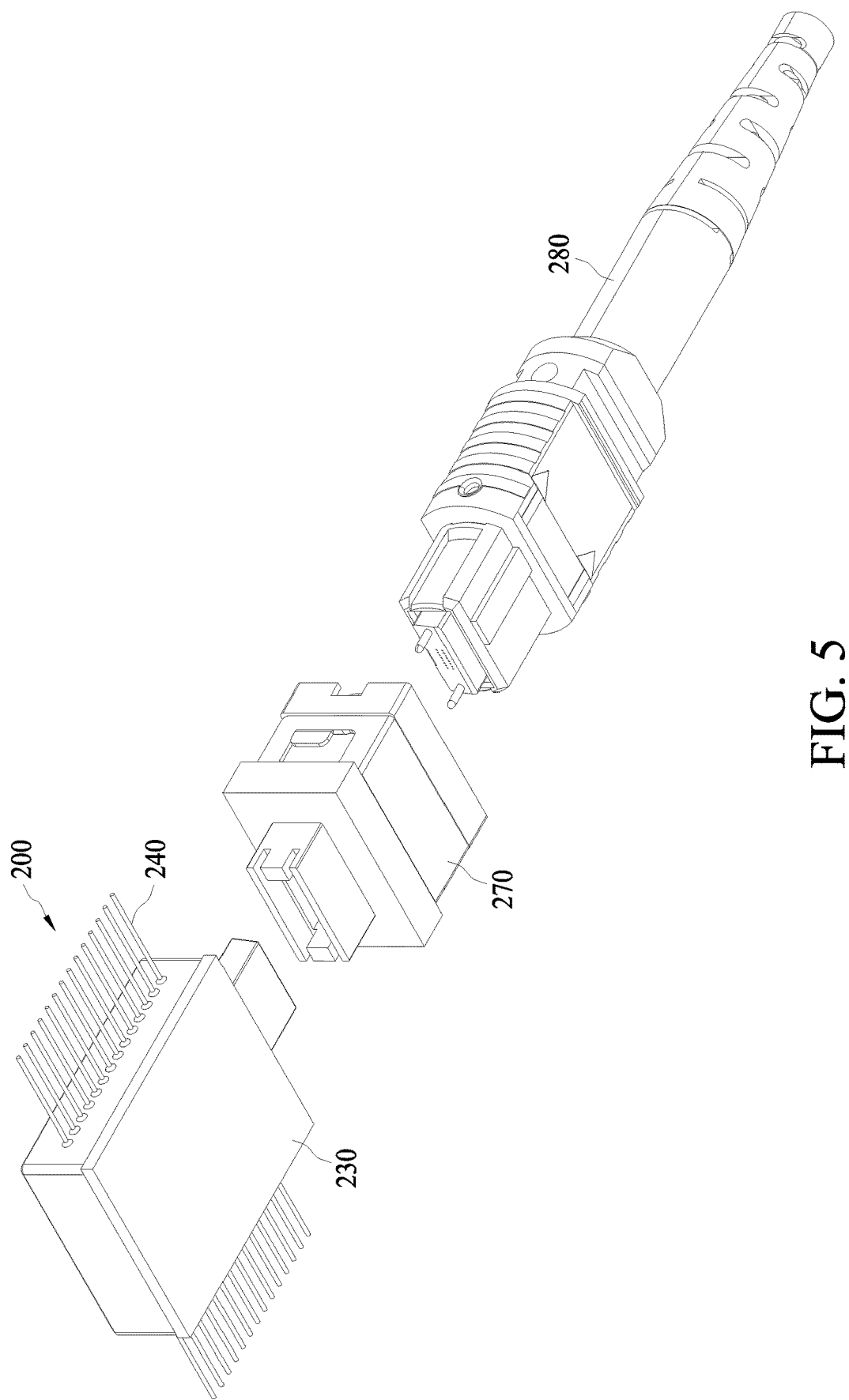
FIG. 5 is a bottom exploded view of the optical module, the adapter, and the joined fiber connector in FIG. 3.
Figure 6:
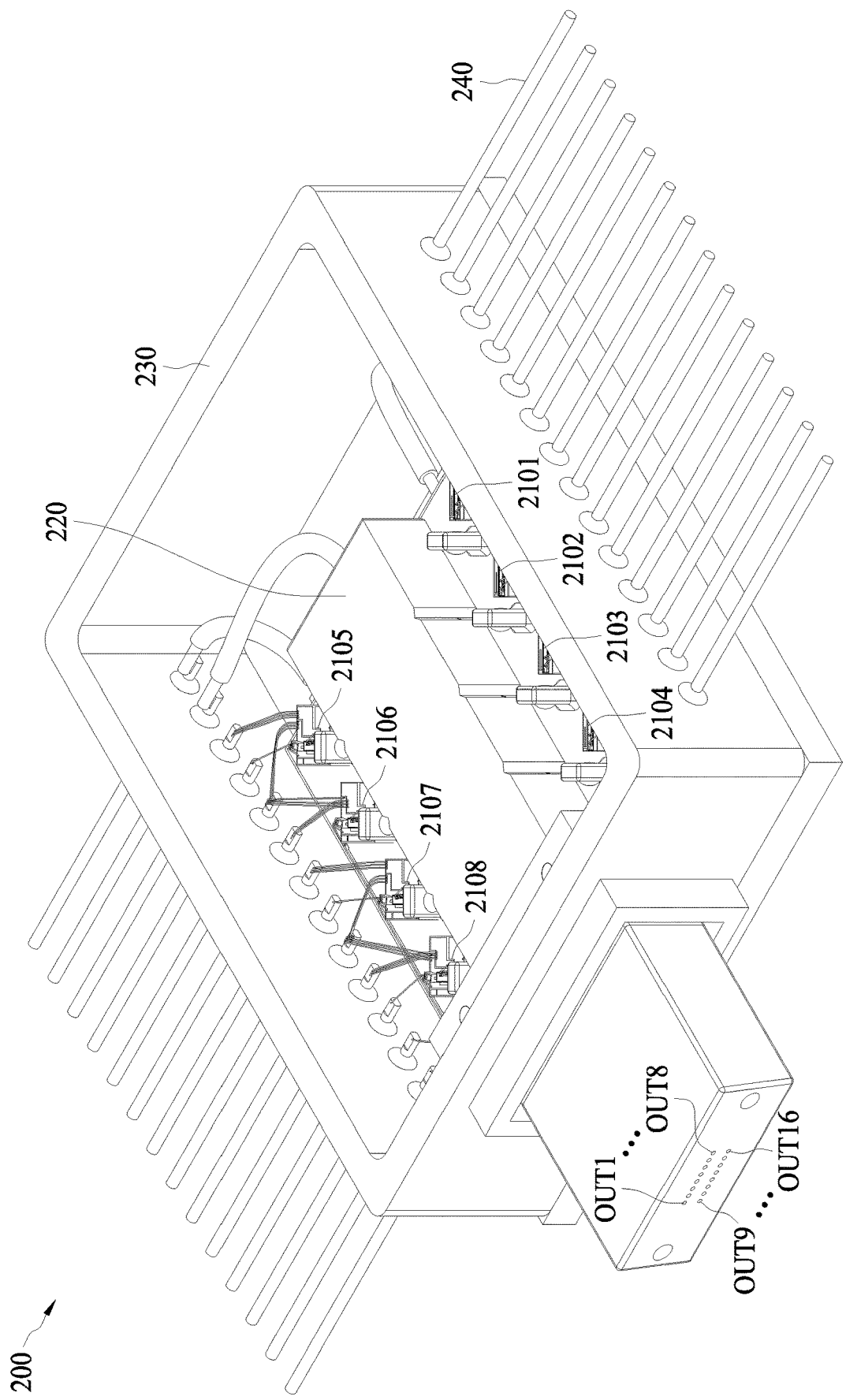
FIG. 6 is an internal schematic diagram of the optical module in FIG. 3.
Figure 7:
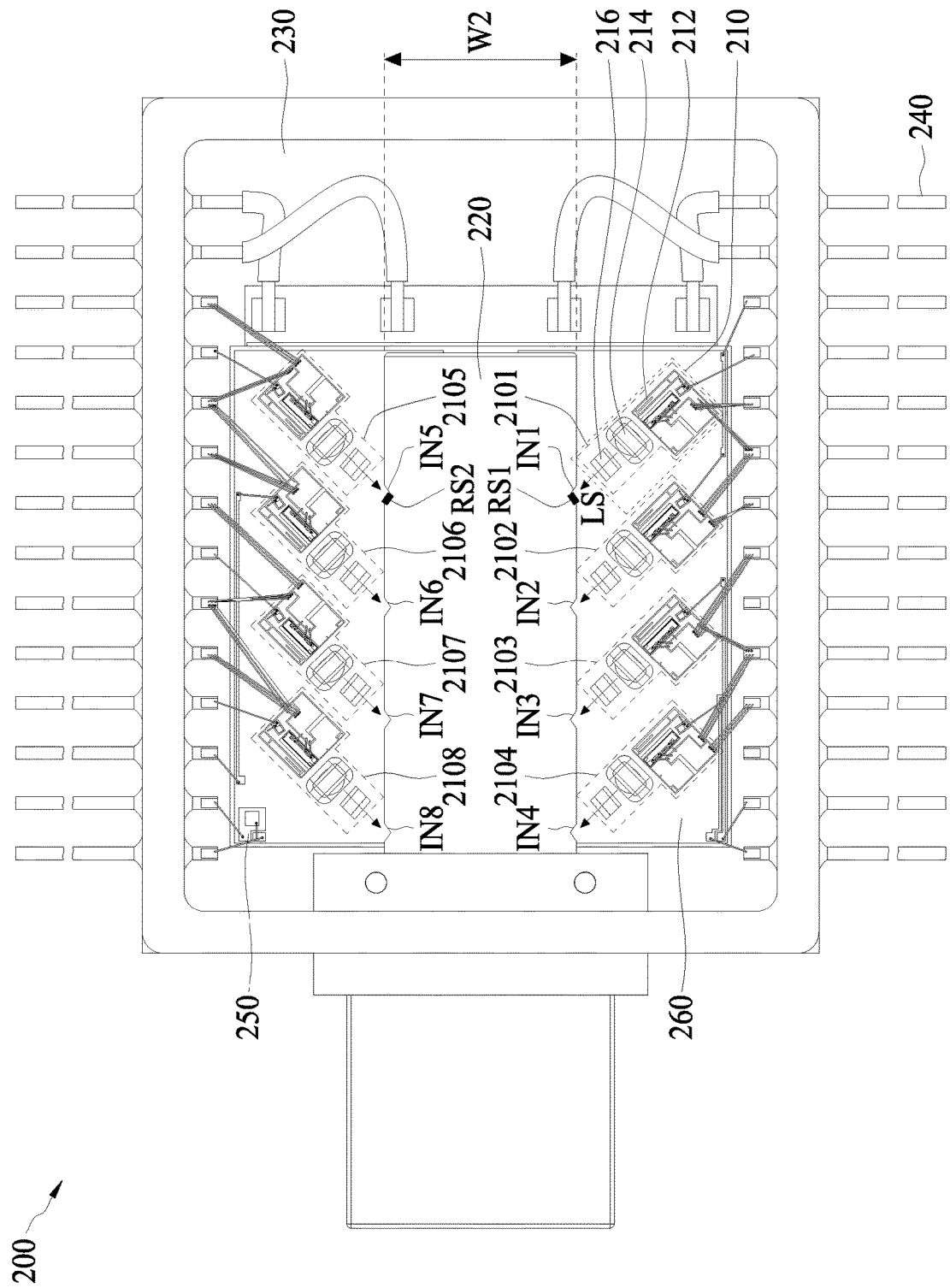
FIG. 7 is an internal top view of the optical module in FIG. 3.

FIG. 3 is a schematic diagram of the appearance of an optical module 200, an adapter 270, and a joined fiber connector 280 according to an embodiment of the present disclosure. FIG. 4 is a top exploded view of the optical module 200, the adapter 270, and the joined fiber connector 280. FIG. 5 is a bottom exploded view of the optical module 200, the adapter 270, and the joined fiber connector 280. FIG. 6 is an internal schematic diagram of the optical module 200. FIG. 7 is an internal top view of the optical module 200.

As shown in FIG. 6 and FIG. 7, the optical module 200 may include light source units 2101 to 2108 and a waveguide interposer 220. In this embodiment, the light source units 2101 to 2108 may have the same structure. As shown in FIG. 7, the light source unit 2101 is used as an example. The light source unit 2101 may include a laser light source 212 and a lens 214. The laser light source 212 may generate laser light LS. The lens 214 may adjust travel directions of light rays in the laser light LS, so that the laser light LS can keep light beams concentrated in a travel process to match a spot mode field of the waveguide. In addition, in some embodiments, the light source unit 2101 may further include an optical isolator 216. The optical isolator 216 may be disposed between the lens 214 and a corresponding input terminal of the waveguide interposer 220, and may be configured to reduce reflected light generated when the laser light LS enters the waveguide interposer 220, thereby reducing noise.

As shown in FIG. 7, the light source units 2101 to 2108 may output laser light to corresponding input terminals in input terminals IN1 to IN8. The input terminals IN1 to IN8 may respectively receive the laser light emitted by corresponding light source units in the light source units 2101 to 2108. Next, the waveguide interposer 220 may guide, via internal waveguide channels, the laser light received by the input terminals IN1 to IN8.

Figure 8:
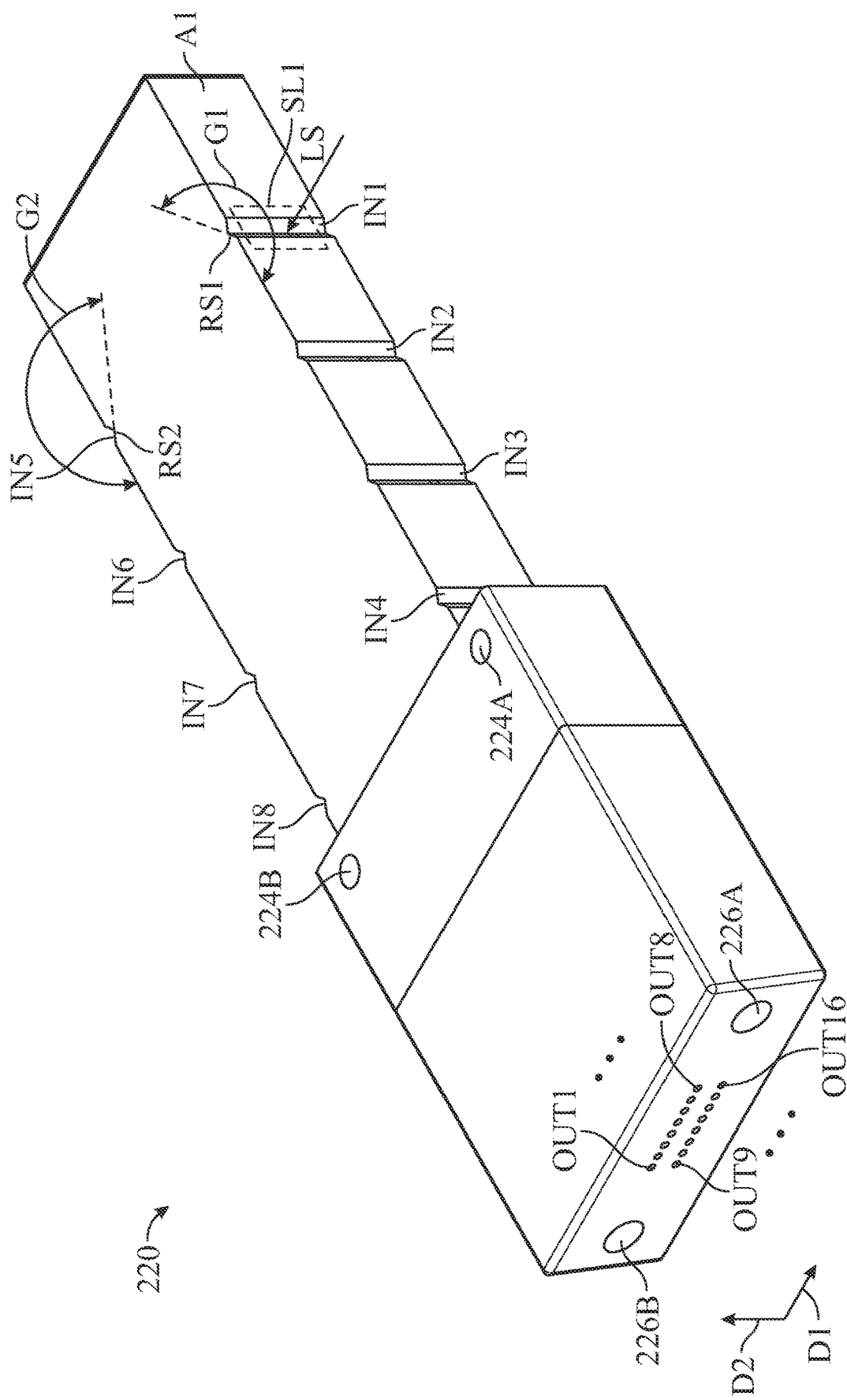
FIG. 8 is a schematic diagram of the appearance of a waveguide interposer in FIG. 6.
Figure 9:
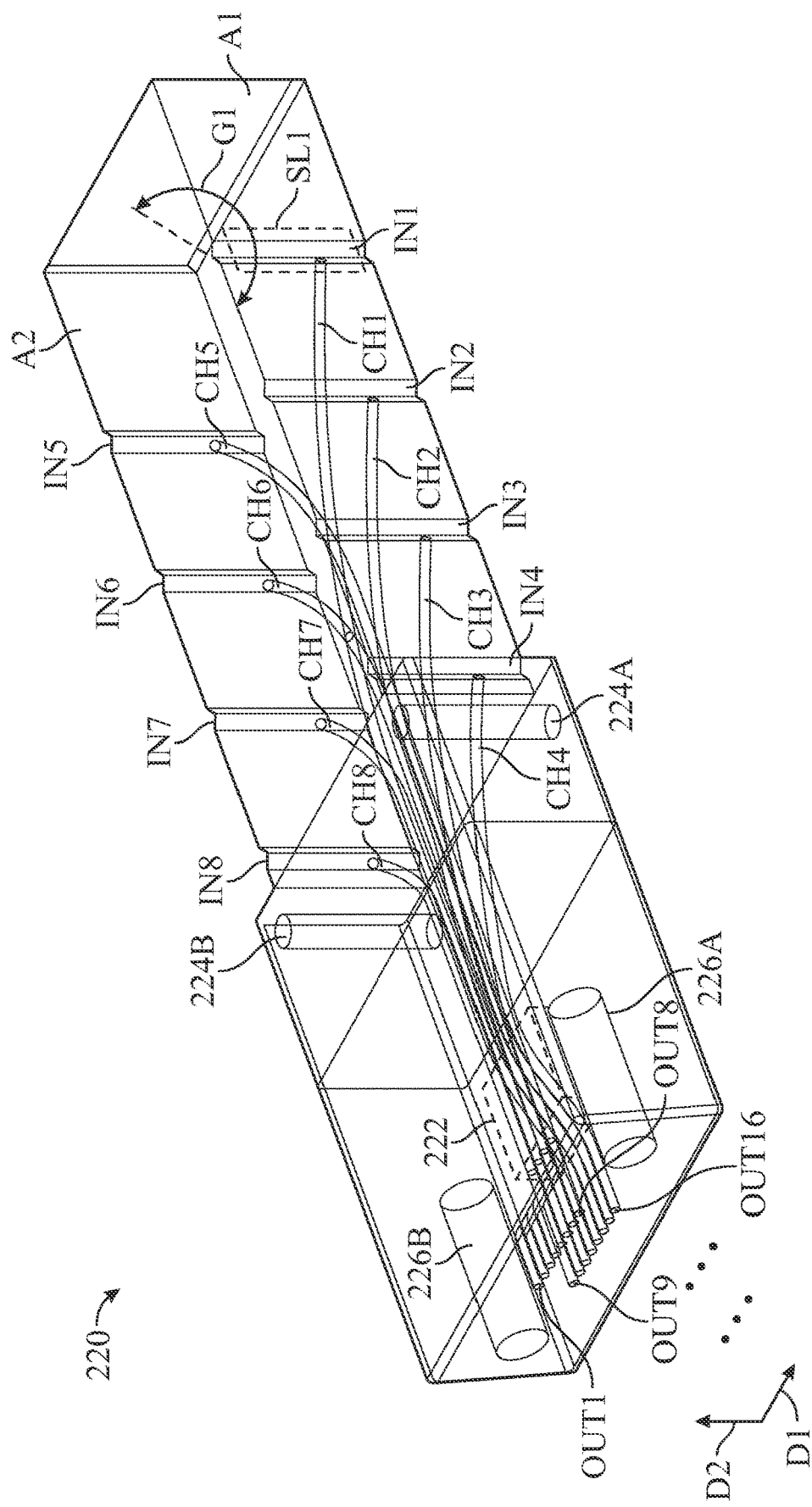
FIG. 9 is an internal perspective view of a waveguide interposer in FIG. 6.

FIG. 8 is a schematic diagram of the appearance of the waveguide interposer 220. FIG. 9 is an internal perspective view of the waveguide interposer 220. As shown in FIG. 8 and FIG. 9, the waveguide interposer 220 may include the input terminals IN1 to IN8, waveguide channels CH1 to CH8, and output terminals OUT1 to OUT16. In the present embodiment, for example, the waveguide interposer 220 may be made of glass, and the waveguide channels CH1 to CH8 that can guide the laser light are formed inside the waveguide interposer 220 through laser etching. In addition, in this embodiment, the waveguide interposer 220 may further include a splitting structure 222. As shown in FIG. 9, the waveguide channels CH1 to CH8 may be respectively coupled to corresponding input terminals in the input terminals IN1 to IN8. The splitting structure 222 may guide the laser light in the waveguide channels CH1 to CH8 to the output terminals OUT1 to OUT16. For example, the splitting structure 222 may guide the laser light transmitted by each of the waveguide channels CH1 to CH8 into two output terminals, and the output terminals OUT1 to OUT16 may be coupled to external fibers so as to output the laser light. In some other embodiments, the splitting structure 222 may guide the laser light transmitted by each of the waveguide channels CH1 to CH8 into more than two output terminals as required. However, in the present disclosure, it is not limited that a total quantity of the output terminals is greater than a total quantity of the input terminals. In some other embodiments, according to system requirements, the splitting structure 222 may be omitted. In such case, the laser light in the input terminal IN1 may pass through a corresponding waveguide channel to be guided to a single output terminal.

In addition, as shown in FIG. 8 and FIG. 9, the waveguide interposer 220 may further include fixing holes 224A and 224B. In some embodiments, fixing bolts are placed in the fixing holes 224A and 224B, so that the waveguide interposer 220 can be fixed on a moisture-proof sealing box 230 of the optical module 200. However, in some other embodiments, the waveguide interposer 220 may be fixed on the moisture-proof sealing box 230 of the optical module 200 by using another fixing structure.

Moreover, as shown in FIG. 8 and FIG. 9, the waveguide interposer 220 may further include guide holes 226A and 226B. When a user couples the optical module 200 to a fiber connector to be joined, the guide holes 226A and 226B may be configured to help the user to rapidly and accurately couple the output terminals OUT1 to OUT16 of the waveguide interposer 220 to corresponding fibers. For example, as shown in FIG. 4, the guide holes 226A and 226B of the waveguide interposer 220 may be used for receiving, through the adapter 270, guide pins 282A and 282B of the fiber connector 280 to be joined, so that the output terminals OUT1 to OUT16 can be coupled to fibers disposed in the joined fiber connector 280. In the present embodiment, the joined fiber connector 280 has the protruding guide pins 282A and 282B and therefore may be considered as a male plug, and the interposer 220 having the guide holes 226A and 226B may be considered as a female socket. However, in some other embodiments, the guide holes 226A and 226B of the waveguide interposer 220 may be replaced with guide pins, and corresponding guide holes may be provided in the joined fiber connector. In this case, the waveguide interposer 220 that has the guide pins is used as a male plug and is joined to the fiber connector that has the guide holes and is therefore considered as a female socket.

Moreover, in some embodiments, the input terminals IN1 to IN8 and the output terminals OUT1 to OUT16 of the waveguide interposer 220 may have different mode field diameter (MFDs). That is, the waveguide interposer 220 may also be used as an MFD converter. As a result, in the waveguide interposer 220, the MFDs of the output terminals OUT1 to OUT16 may be designed as required, so that the output terminals OUT1 to OUT16 can be coupled to external fibers, for example, the fibers in the joined fiber connector 280. For example, for the waveguide interposer 220, the MFD of the input terminal may be 5 μm, and the MFD of the output terminal may be 9 μm.

In some embodiments, to cooperate with an arrangement manner of the fibers in the fiber connector 280, the output terminals OUT1 to OUT16 may be arranged into a plurality of rows. For example, in FIG. 8, the output terminals OUT1 to OUT8 may be disposed in the same row, and the output terminals OUT9 to OUT16 may be disposed in another row different from the row in which the output terminals OUT1 to OUT8 are disposed. In addition, the output terminals OUT1 to OUT8 located in the same row may be disposed in a first direction D1, and the output terminals OUT1 and OUT9 located in different rows may be disposed in a second direction D2 different from the first direction D1. That is, the optical module 200 may use the splitting structure 222 to guide the laser light in the waveguide channels to two output terminals located in different rows, to cooperate with the structure of the joined fiber connector 280. In such way, the optical module 200 may be coupled to the fibers in the fiber connector 280 of a 16-core mechanical transfer (MT) type, preventing the design of the waveguide channels in the waveguide interposer 220 from becoming excessively complex.

The optical module 200 may join the waveguide interposer 220 and the external fiber connector 280 with the adapter 270. Therefore, for example, the fiber array 130 shown in FIG. 1 does not need to be additionally disposed between the waveguide interposer 220 and the joined fiber connector 280, and the waveguide interposer 220 does not need to be additionally joined to the fiber connector 280 through the fiber connector 150. That is, compared with the optical module 100 in the prior art, the optical module 200 can reduce transmission interface transfer that the laser light needs to undergo when the laser travels inside the optical module 200, so that the energy loss of the laser light is reduced, the quality of signal transmission is improved, and hardware elements required for the optical module 200 can be reduced.

In addition, as shown in FIG. 8, the input terminals IN1 to IN4 may be disposed on a first side A1 of the waveguide interposer 220. In this embodiment, on the first side A1 of the waveguide interposer 220, each of the input terminals IN1 to IN4 may have a groove structure. The input terminal IN1 is used as an example. An inner concave surface in a groove structure SL1 of the input terminal IN1 may be used as a light receiving surface RS1 of the input terminal IN1. An angle G1 greater than 180 degrees and less than or equal to 270 degrees may exist between the light receiving surface RS1 and the first side A1 of the waveguide interposer 220 joining the light receiving surface RS1. In such case, as shown in FIG. 7, the light source unit 2101 may be disposed right opposite the light receiving surface RS1 of the input terminal IN1, so that the laser light emitted by the light source unit 2101 can vertically enter the light receiving surface RS1. That is, the laser light does not vertically enter the first side A1 of the waveguide interposer 220, and vertically enters the light receiving surface RS1 of the input terminal IN1. Therefore, in a case that the angle G1 between the light receiving surface RS1 and the first side A1 joining the light receiving surface RS1 is 225 degrees, the waveguide channel CH1 of the waveguide interposer 220 only needs to further deflect the laser light by 45 degrees to enable the laser light to vertically enter the splitting structure 222 and to be guided to a corresponding output terminal. That is, the angle G1 between the light receiving surface RS1 of the input terminal IN1 and the first side A1 of the waveguide interposer 220 joining the light receiving surface RS1 is appropriately designed, and the light source unit 2101 is correspondingly disposed, so that a deflection angle of the laser light in the waveguide interposer 220 can be reduced, thereby reducing a turning space required for the waveguide channel CH1 and reducing the width W2 of the waveguide interposer 220. In addition, as the angle G1 approaches 270 degrees, the width W2 can be further minimized. Certainly, if there is no demand for reducing the width W2 of the waveguide interposer 220, the angle G1 may be equal to 180 degrees such that the light receiving surface RS1 is coplanar with the first side A1.

Similarly, as shown in FIG. 8, the input terminals IN5 to IN8 may be disposed on a second side A2 of the waveguide interposer 220. The first side A1 of the waveguide interposer 220 and the second side A2 are parallel and opposite to each other. In addition, each of the input terminals IN5 to IN8 may also have a groove structure, and an angle G2 greater than 180 degrees and less than or equal to 270 degrees may exist between a light receiving surface RS2 of the groove structure of the input terminal and the second side A2 of the waveguide interposer 220 joining the second light receiving surface RS2. In such case, as shown in FIG. 7, the light source unit 2105 may be disposed right opposite the light receiving surface RS2 of the input terminal IN5, so that the laser light emitted by the light source unit 2105 can vertically enter the light receiving surface RS2. In this way, the deflection angle of the laser light in the waveguide interposer 220 can be reduced, thereby reducing a turning space required for the waveguide channel CH5, and reducing the width W2 of the waveguide interposer 220. In addition, when the angle G2 approaches 270 degrees, the width W2 can be further minimized. Certainly, if there is no demand for reducing the width W2 of the waveguide interposer 220, the angle G2 may be equal to 180 degrees such that the second light receiving surface RS2 is coplanar with the second side A2. Moreover, the angle G1 and the angle G2 may be the same or different as required.

In addition, in the present embodiment, the first side A1 of the waveguide interposer 220 and the second side A2 are parallel and opposite to each other. However, the present invention is not limited thereto. In some embodiments, the input terminals may be disposed on two adjacent sides of the waveguide interposer 220 according to an actual requirement. That is, the input terminals may be disposed on any two or more different sides of the waveguide interposer 220. Moreover, in FIG. 8 and FIG. 9, the waveguide interposer 220 is a rectangular cylindrical body. However, the present invention is not limited thereto. In some other embodiments, the waveguide interposer 220 may have another shape, for example, a triangular cylindrical body.

As shown in FIG. 6 and FIG. 7, the optical module 200 may further include the moisture-proof sealing box 230 and pins 240. The moisture-proof sealing box 230 may accommodate the light source units 2101 to 2108 and the waveguide interposer 220, and can prevent permeation of external moisture, thereby reducing a probability that the light source units 2101 to 2108 and the waveguide interposer 220 are exposed to moisture to inflict damage.

As shown in FIG. 6 and FIG. 7, the pins 240 may be disposed on a lateral side of the moisture-proof sealing box 230, and the material may be an iron-cobalt-nickel alloy. Each pin 240 may have a first terminal and a second terminal. The first terminal of each pin 240 may be disposed on an inner side of the moisture-proof sealing box 230, and may be connected to a corresponding light source unit in the light source units 2101 to 2108 or other electronic element by a bonding wire. The second terminal of each pin 240 may be disposed on an outer side of the moisture-proof sealing box 230 to receive an electrical signal. As a result, the light source units 2101 to 2108 may correspondingly generate laser light signals according to control signals and/or power signals transferred from the pins 240, and output the laser light signals through the waveguide interposer 220.

As shown in FIG. 7, the optical module 200 may further include at least one temperature detector 250 and a thermoelectric cooler (TEC) 260. The temperature detector 250 may be, for example, disposed at a position near the light source units 2101 to 2108 to detect the temperature around the light source units 2101 to 2108. The TEC 260 may include, for example, a thermoelectric element. When a current is introduced into the thermoelectric element, one surface of the thermoelectric element absorbs heat, and the other surface releases heat. Therefore, by introducing currents into the thermoelectric element, a heat absorption surface of the thermoelectric element may achieve heat dissipation and temperature balancing.

In the present embodiment, the TEC 260 may be connected to the temperature detector 250, and may be disposed below the light source units 2101 to 2108. In such way, the TEC 260 may adjust the temperature of the light source units 2101 to 2108 according to the temperature detected by the temperature detector 250. For example, when the temperature detected by the temperature detector 250 rises, the TEC 260 may introduce a current into the thermoelectric element so as to absorb thermal energy near the light source units 2101 to 2108, thereby achieving heat dissipation.

As shown in FIG. 7, the optical module 200 may include eight light source units 2101 to 2108. However, in some other embodiments, a designer may increase or reduce a quantity of the light source units as required, and correspondingly adjust a total quantity of the input terminals and a total quantity of the output terminals of the waveguide interposer 220.

Figure 10:
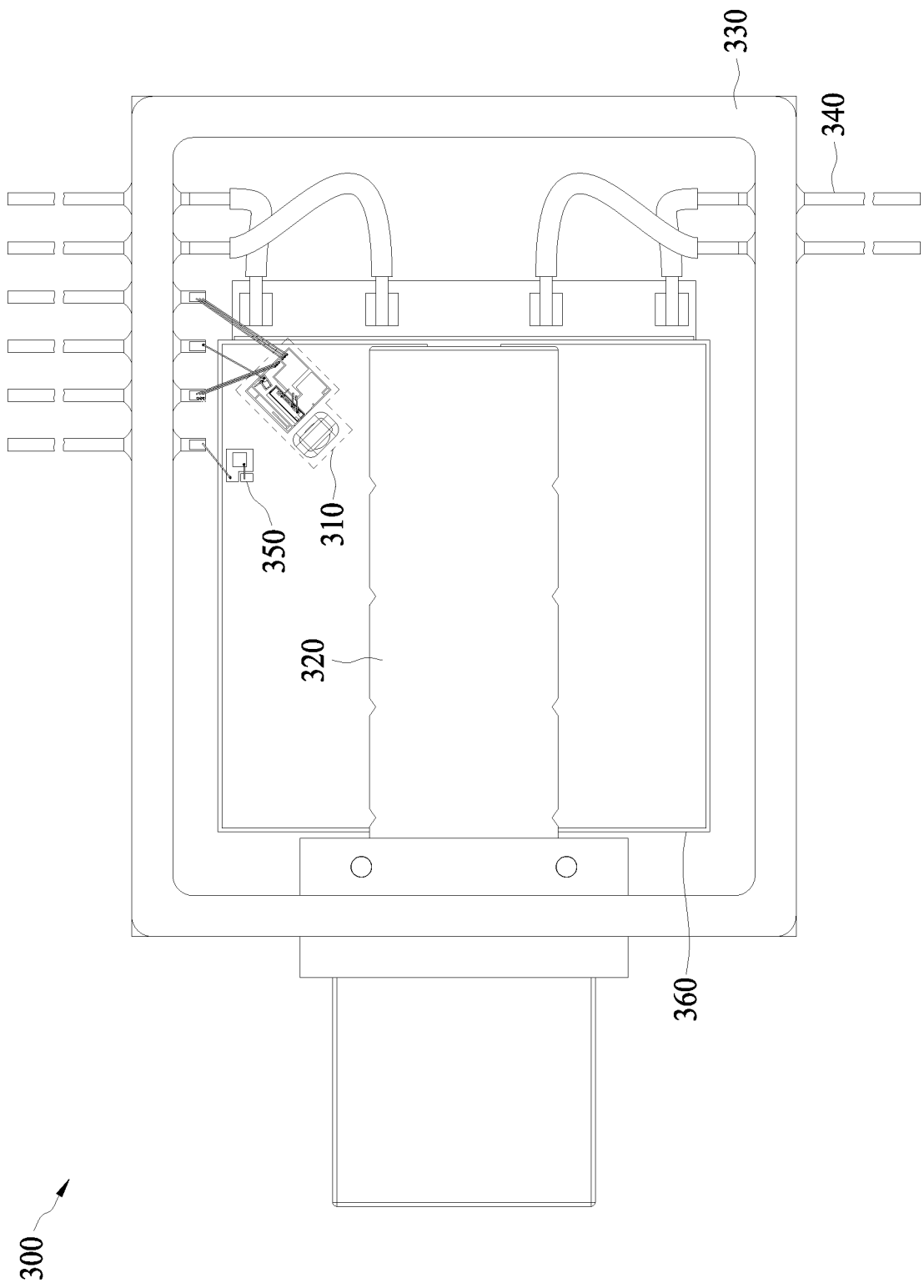
FIG. 10 is an internal top view of an optical module according to another embodiment of the present disclosure.
Figure 11:
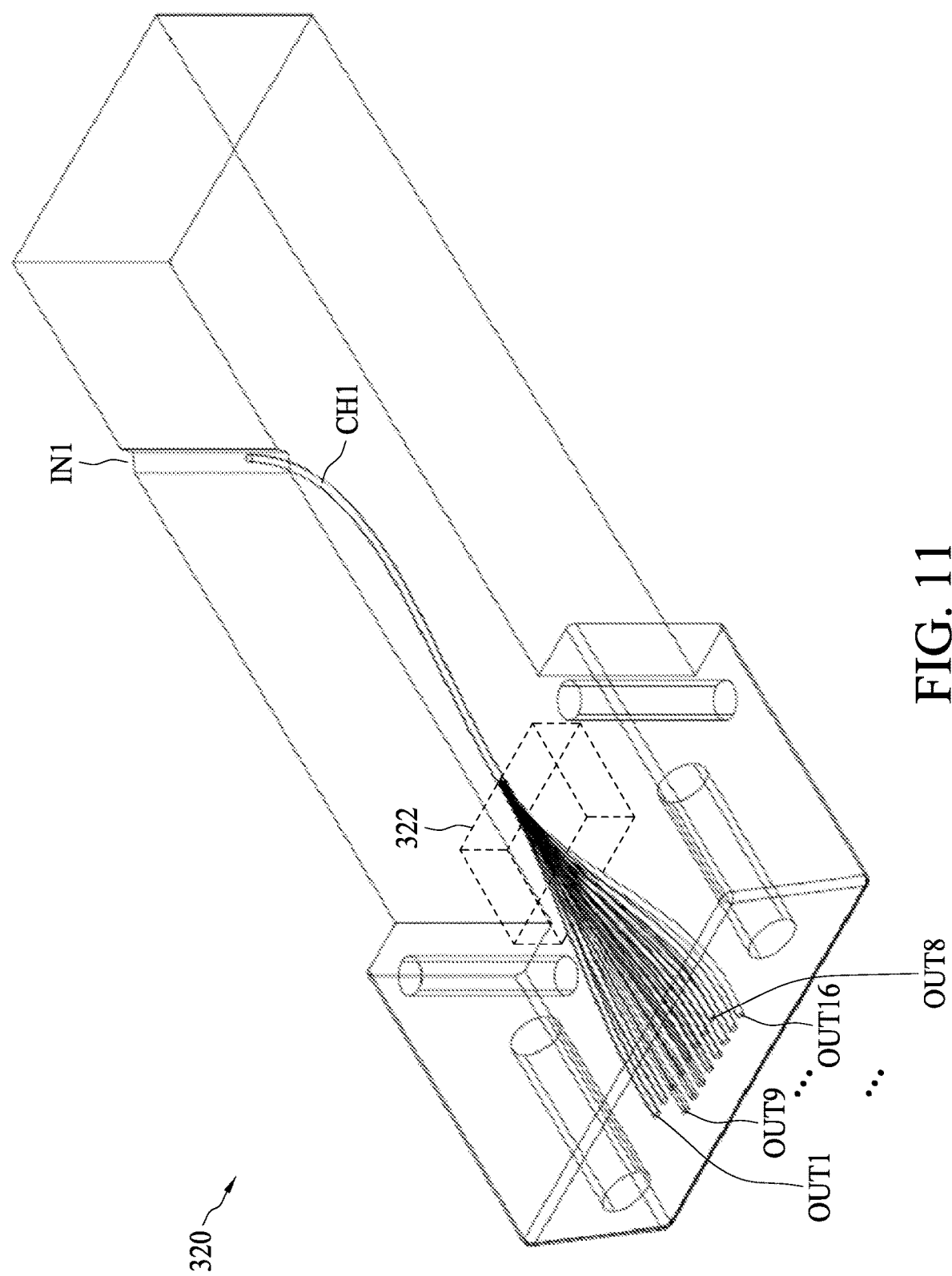
FIG. 11 is an internal perspective view of a waveguide interposer in FIG. 10.

FIG. 10 is an internal top view of an optical module 300 according to another embodiment of the present disclosure. The optical module 300 includes a light source unit 310, a waveguide interposer 320, a moisture-proof sealing box 330, pins 340, a temperature detector 350, and a TEC 360. FIG. 11 is an internal perspective view of the waveguide interposer 320 according to an embodiment of the present disclosure. The waveguide interposer 320 may include an input terminal IN1, a waveguide channel CH1, a splitting structure 322, and output terminals OUT1 to OUT16. In FIG. 7, after being guided by the waveguide channel CH1 to enter the splitting structure 322, laser light received by the input terminal IN1 is further guided by the splitting structure 322 to the output terminals OUT1 to OUT16.

In summary, the optical modules provided in the embodiments of the present disclosure may use a waveguide interposer to guide laser light generated by a light source unit to output terminals of the waveguide interposer so as to be directly coupled to fibers in an external joined fiber connector. Therefore, transmission interface transfer that the laser light needs to undergo when the laser light travels inside can be reduced, thereby reducing the energy loss of the laser light and improving the quality of signal transmission.

Although the present disclosure and advantages of the present disclosure have been described in detail, it should be understood that various changes, substitutions, and replacements may be made without departing from the spirit and scope of the present disclosure as defined in the claims. For example, many foregoing processes may be implemented by using different methods, and the many foregoing processes may be replaced with other processes or combinations thereof.

In addition, the scope of the present disclosure is not limited to specific embodiments of the processes, machines, manufacturing, substance composition, measures, methods, and steps in the specification. A person skilled in the art may understand from the disclosed content of the present disclosure that according to the present disclosure, processes, machines, manufacturing, substance composition, measures, methods or steps that currently exist or will be developed in the future that perform functions basically the same as those in the corresponding embodiments herein or obtain results basically the same as those in the embodiments herein may be used. Therefore, the appended claims are intended to cover these processes, machines, manufacturing, substance composition, measures, methods or steps.

What is claimed is:

1. An optical module, comprising:
a waveguide interposer, comprising:
at least one input terminal, configured to receive laser light, the at least one input terminal comprising at least one first input terminal disposed on a first side of the waveguide interposer, each of the at least one first input terminal having a first light receiving surface, wherein a first angle, from a first outer surface of the first side joining the first light receiving surface to the first light receiving surface, is greater than 180 degrees and less than 270 degrees;
at least one waveguide channel, coupled to the at least one input terminal, and configured to guide the laser light; and
at least one output terminal; and
at least one light source unit, wherein each light source unit in the at least one light source unit is configured to output the laser light to a corresponding input terminal of the at least one input terminal.

2. The optical module according to claim 1, wherein each light source unit in the at least one light source unit comprises:
a laser light source, configured to generate the laser light; and
a lens, configured to adjust a travel direction of the laser light.

3. The optical module according to claim 2, wherein each light source unit in the at least one light source unit further comprises an optical isolator, disposed between the lens and a corresponding input terminal in the at least one input terminal, and configured to reduce reflected light generated when the laser light enters the corresponding input terminal.

4. The optical module according to claim 2, wherein the lens is further configured to keep light beams of the laser light concentrated in a travel process to match a spot mode field of a waveguide.

5. The optical module according to claim 1, wherein the material of the waveguide interposer is glass or silicon.

6. The optical module according to claim 1, wherein:
the at least one input terminal further comprises at least one second input terminal, disposed on a second side of the waveguide interposer,
the first side and the second side are in different planes, each of the at least one second input terminal has a second light receiving surface, and
a second angle, from a second outer surface of the second side joining the second light receiving surface to the second light receiving surface, is greater than 180 degrees and less than or equal to 270 degrees.

7. The optical module according to claim 1, wherein:
the at least one input terminal further comprises at least one second input terminal, disposed on a second side of the waveguide interposer,
the first side and the second side are in different planes, and
each of the at least one second input terminal has a second light receiving surface coplanar with a second outer surface of the second side joining the second light receiving surface.

8. The optical module according to claim 1, wherein:
the at least one input terminal comprises at least one additional input terminal, disposed on the first side of the waveguide interposer, and
each of the at least one additional input terminal has an additional light receiving surface coplanar with an additional outer surface of the first side joining the additional light receiving surface.

9. The optical module according to claim 8, wherein:
the at least one input terminal further comprises at least one second input terminal, disposed on a second side of the waveguide interposer,
the first side and the second side are in different planes, and
each of the at least one second input terminal has a second light receiving surface, and
a second angle, from a second outer surface of the second side joining the second light receiving surface to the second light receiving surface, is greater than 180 degrees and less than or equal to 270 degrees.

10. The optical module according to claim 8, wherein:
the at least one input terminal further comprises at least one second input terminal, disposed on a second side of the waveguide interposer,
the first side and the second side are in different planes,
each of the at least one second input terminal has a second light receiving surface coplanar with a second outer surface of the second side joining the second light receiving surface.

11. The optical module according to claim 1, further comprising:
a moisture-proof sealing box, configured to accommodate the at least one light source unit and the waveguide interposer.

12. The optical module according to claim 1, further comprising: at least one pin, disposed on at least one lateral side of a moisture-proof sealing box, a first terminal of each pin in the at least one pin being disposed on an inner side of the moisture-proof sealing box and configured to be connected to one of the at least one light source unit by a bonding wire, a second terminal being disposed on an outer side of the moisture-proof sealing box and configured to receive an electrical signal.

13. The optical module according to claim 1, further comprising:
at least one temperature detector; and
a thermoelectric cooler (TEC), connected to the at least one temperature detector, disposed below the at least one light source unit, and configured to adjust temperature of the at least one light source unit according to at least one temperature detected by the at least one temperature detector.

14. The optical module according to claim 1, wherein the at least one output terminal is configured to output the laser light and is coupled to at least one fiber of a joined fiber connector.

15. The optical module according to claim 14, wherein the joined fiber connector is a fiber connector of a mechanical transfer (MT) type.

16. An optical module, comprising:
a waveguide interposer, comprising:
at least one input terminal, configured to receive laser light,
at least one waveguide channel, coupled to the at least one input terminal, and configured to guide the laser light; and
at least one light source unit, wherein each light source unit in the at least one light source unit is configured to output the laser light to a corresponding input terminal of the at least one input terminal; and
a splitting structure, configured to guide the laser light transmitted by each of the at least one waveguide channel into a plurality of output terminals;
wherein a total quantity of the plurality of output terminals is greater than a total quantity of the at least one input terminal.

17. The optical module according to claim 16, wherein the plurality of output terminals are arranged into a plurality of rows, a plurality of output terminals located in a same row are disposed in a first direction, and a plurality of output terminals located in different rows are disposed in a second direction different from the first direction.

18. An optical module, comprising:
a waveguide interposer, comprising:
at least one input terminal, configured to receive laser light;
at least one waveguide channel, coupled to the at least one input terminal, and configured to guide the laser light; and
at least one output terminal; and
at least one light source unit, wherein each light source unit in the at least one light source unit is configured to output the laser light to a corresponding input terminal of the at least one input terminal, and wherein each light source unit in the at least one light source unit comprises:
a laser light source, configured to generate the laser light; and
a lens, configured to adjust a travel direction of the laser light.

19. The optical module according to claim 18, wherein each light source unit in the at least one light source unit further comprises an optical isolator, disposed between the lens and a corresponding input terminal in the at least one input terminal, and configured to reduce reflected light generated when the laser light enters the corresponding input terminal.

* * * * *